(12) United States Patent
Sadate et al.

(10) Patent No.: US 8,854,097 B2
(45) Date of Patent: Oct. 7, 2014

(54) LOAD SWITCH

(71) Applicant: Texas Instruments Incorporated, Dallas, TX (US)

(72) Inventors: Aline C. Sadate, Allen, TX (US); William E. Grose, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/786,151

(22) Filed: Mar. 5, 2013

(65) Prior Publication Data

US 2014/0253194 A1 Sep. 11, 2014

(51) Int. Cl.
*H03K 5/12* (2006.01)
*H03K 19/0185* (2006.01)

(52) U.S. Cl.
CPC .............. *H03K 19/018571* (2013.01)
USPC .............. 327/170; 327/172; 327/176

(58) Field of Classification Search
USPC .......... 327/131, 134, 170–172, 176
See application file for complete search history.

(56) References Cited

U.S. PATENT DOCUMENTS 7,061,291 B2 * 6/2006 Jacobs et al. ................. 327/170
2009/0289692 A1 11/2009 Chen

* cited by examiner

*Primary Examiner* — An Luu
(74) *Attorney, Agent, or Firm* — Alan A. R. Cooper; Frederick J. Telecky, Jr.

(57) ABSTRACT

An IC generally comprises enable pin, ground pin, input pin, output pin, load switch, control circuitry, and level shifter. Load switch is coupled between the input pin and output pin and receives a negative voltage through the input pin. The control circuitry is coupled to the enable pin, the ground pin, and the load switch and controls the load switch and uses ground pin as positive supply rail and input pin as an internal ground. Voltage applied to the input terminal is negative, enabling pulling of the gate of a transistor of a level shifter to ground turns transistor as "on," enabling a negative output signal to be provided through output pin VOUT. Therefore, the output signal (at output pin VOUT) can be ground (applied to the ground pin GND) when the transistor is "off" and can be the negative voltage (applied to the input pin VIN) when transistor is "on."

10 Claims, 2 Drawing Sheets

US 8,854,097 B2

LOAD SWITCH

TECHNICAL FIELD

The invention relates generally to a load switch and, more particularly, to a load switch that uses a negative input.

BACKGROUND

Most integrated load switches support positive inputs. However, for applications that use negative inputs, conventional integrated load switches employ both a positive supply and a negative supply, which usually requires an extra pin or extra internal circuitry. An example of this is U.S. Patent Pre-Grant Publ. No. 2009/0289692. The inclusion of additional circuitry and/or an additional pin typically increases the cost of the integrated switch. Therefore, there is a need for an improved load switch.

SUMMARY

A preferred embodiment of the present invention, accordingly, provides an integrated circuit (IC). The IC comprises an enable pin; a ground pin; an input pin; an output pin; a load switch that is coupled between the input pin and the output pin, wherein the load switch receives a negative voltage through the input pin; and control circuitry that is coupled to the enable pin, the ground pin, and the load switch, wherein the control circuitry controls the load switch, and wherein the control circuitry uses the ground pin as a positive supply rail and the input pin as an internal ground.

In accordance with a preferred embodiment of the present invention, the control circuitry further comprises: a level shifter that is coupled to the ground pin, the input pin, and the enable pin; and a slew rate controller that is coupled to the level shifter, the input pin, and the load switch.

In accordance with a preferred embodiment of the present invention, the level shifter further comprises: a current mirror that is coupled to the input pin; a current control circuit that is coupled between the ground pin and the current mirror; a transistor having a first passive electrode, a second passive electrode, and a control electrode, wherein the control electrode of the transistor is coupled to the ground pin, and wherein the first passive electrode of the transistor is coupled to the enable pin; and an impedance network that is coupled between the second passive electrode of the transistor and the current mirror and that is coupled to the slew rate controller.

In accordance with a preferred embodiment of the present invention, the impedance network further comprises a first impedance network, and wherein the transistor further comprise a first transistor, and wherein the slew rate controller further comprises: an inverter having a first power terminal, a second power terminal, an input terminal, and an output terminal, wherein the first power terminal of the inverter is coupled to the ground pin, and wherein the second power terminal of the inverter is coupled to the input pin, and wherein the input terminal of the inverter is coupled to the first impedance network; a second transistor having a first passive electrode, a second passive electrode, and a control electrode, wherein the control electrode of the second transistor is coupled to the output terminal of the inverter, and wherein the first passive electrode of the second transistor is coupled to the ground pin; a second impedance network that is coupled to the second passive electrode of the second transistor and the load switch; and a third transistor having a first passive electrode, a second passive electrode, and a control electrode, wherein the control electrode of the third transistor is coupled to the output terminal of the inverter, and wherein the first passive electrode of the third transistor is coupled to the second impedance network, and wherein the second passive electrode of the third transistor is coupled to the input pin.

In accordance with a preferred embodiment of the present invention, the first impedance network further comprises a plurality of resistors coupled in series with one another.

In accordance with a preferred embodiment of the present invention, the first, second, and third transistors further comprise a first PMOS transistor, a second PMOS transistor, and an NMOS transistor.

In accordance with a preferred embodiment of the present invention, a method is provided. The method comprises level shifting an enable signal to generate an intermediate signal by using input pin as an in as an internal ground and ground pin as a positive supply rail, wherein a negative voltage is applied to the input pin; controlling the skew of the intermediate signal; and activating a load switch with a skew-controlled intermediate signal, wherein the load switch is coupled between an output pin and the input pin.

In accordance with a preferred embodiment of the present invention, the step of level shifting further comprises: generating a steering current between the ground pin and the input pin; activating a first transistor when the enable signal becomes greater than the threshold voltage of the first transistor; mirroring the steering current when the first transistor is activated; dividing the enable signal to generate the intermediate signal; and applying the intermediate signal to a skew rate controller so as to generate the skew-controlled intermediate signal.

In accordance with a preferred embodiment of the present invention, the load switch further comprises an NMOS transistor, and wherein the step of activating the load switch further comprises pulling the gate of the NMOS transistor to ground.

In accordance with a preferred embodiment of the present invention, an IC is provided. The IC comprises an enable pin; a ground pin; an input pin; an output pin; and a NMOS transistor that is coupled to the output pin at its drain and the input pin at its source, wherein the a negative voltage is applied to the source of the NMOS transistor through the input pin; and control circuitry that is coupled to the enable pin, the ground pin, and the load switch, wherein the control circuitry controls the load switch, and wherein the control circuitry uses the ground pin as a positive supply rail and the input pin as an internal ground.

In accordance with a preferred embodiment of the present invention, the level shifter further comprises: a current mirror that is coupled to the input pin; a resistor that is coupled between the ground pin and the current mirror; a PMOS transistor that is coupled to the ground pin at its gate and the enable pin at its source; and an voltage divider that is coupled between the drain of the PMOS transistor and the current mirror.

In accordance with a preferred embodiment of the present invention, the NMOS transistor further comprises a first NMOS transistor, and wherein the resistor further comprises a first resistor, and wherein the slew rate controller further comprises: an inverter having a first power terminal, a second power terminal, an input terminal, and an output terminal, wherein the first power terminal of the inverter is coupled to the ground pin, and wherein the second power terminal of the inverter is coupled to the input pin, and wherein the input terminal of the inverter is coupled to the voltage divider; a second PMOS transistor that is coupled to the output terminal of the inverter at its gate and the ground pin at its source; a second resistor that is coupled to the drain of the second PMOS transistor and the gate of the first NMOS transistor; and a second NMOS transistor that is coupled to the output terminal of the inverter at its gate, the second resistor at its drain, and the input pin at its source.

In accordance with a preferred embodiment of the present invention, the voltage divider further comprises: a third resistor that is coupled between the drain of the first PMOS transistor and the input terminal of the inverter; and a fourth resistor that is coupled between the input terminal of the inverter and the current mirror.

In accordance with a preferred embodiment of the present invention, the current mirror further comprises: a third NMOS transistor that is coupled to the first resistor at its drain and gate and the input pin at its source; and a fourth NMOS transistor that is coupled to the fourth resistor at its drain, the gate of the third NMOS transistor at its gate, and the input pin at its source.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
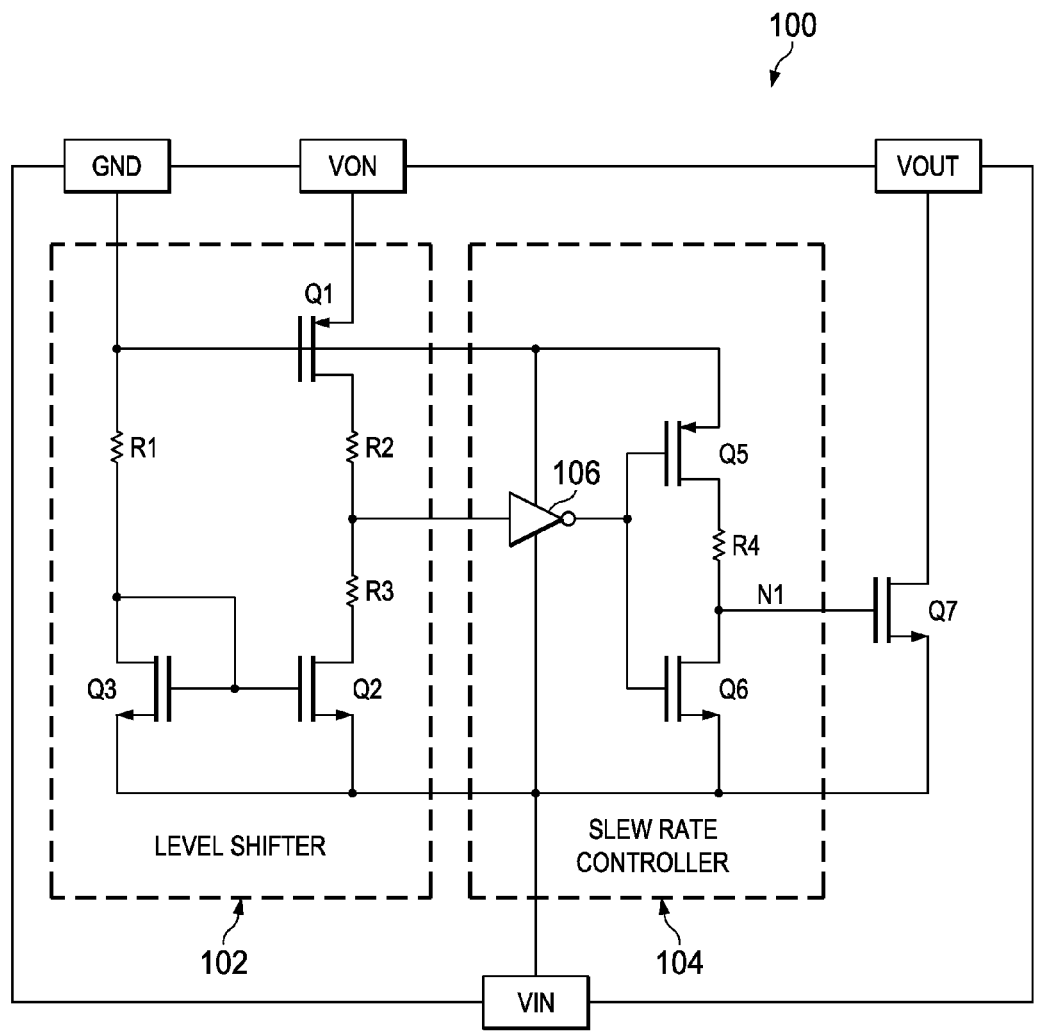
FIG. 1 is an example of an integrated circuit (IC) in accordance with a preferred embodiment of the present invention.

Refer now to the drawings wherein depicted elements are, for the sake of clarity, not necessarily shown to scale and wherein like or similar elements are designated by the same reference numeral through the several views.

Turning to FIG. 1, an IC 100 in accordance with a preferred embodiment of the present invention can be seen. Typically, the IC 100 includes an input pin VIN, an output pin VOUT, a ground pin GND, an enable pin VON, load switch Q7 (which can, for example, be an NMOS transistor), a level shifter 102, and a slew rate controller 104. The level shifter 102 generally comprises a current control circuit (i.e., resistor R1), a current mirror (i.e., NMOS transistors Q3 and Q2), transistor Q1 (which can, for example, be a PMOS transistor), and a voltage divider or impedance network (i.e., resistors R2 and R3). The slew rate controller 104 generally comprises inverter 106, transistors Q5 and Q6 (which can, for example, be a PMOS transistor and an NMOS transistor, respectively), and an impedance network (i.e., resistor R4).

In operation, the control circuit (which is generally formed by level shifter 104 and slew control circuit 104) uses the ground pin GND as a positive supply rail and the input pin VIN as an internal ground to generate a negative output voltage at output pin VOUT. This can be accomplished because a negative voltage is applied to the input pin VIN (i.e., −5V), which means the ground pin GND, which is coupled to that ground (i.e., 0V), has a higher voltage than the input pin VIN. When the enable signal or voltage (applied to the enable pin VON) is less than the threshold voltage of the transistor Q1, transistor Q1 is "off," which pulls the input terminal of inverter 106 to the negative voltage (supplied through the input pin VIN) and which maintains the transistor Q7 (i.e., the load switch) in an "off" state. Once the enable signal becomes greater than the threshold voltage of transistor Q1, transistor Q1 turns "on." With transistor Q1 in an "on" state, a steering current is generated through resistor R1 and transistor Q3 (which is diode-connected). This steering current is mirrored through resistors R2 and R3 and transistor Q1. Because the resistor R3 has a much larger resistance than resistor R2 (which generally limits the maximum gate-source voltage seen by transistor Q2 for both the "on" and "off" states of transistor Q1), the intermediate signal or voltage (at the node between resistors R2 and R3) becomes a fraction of the "on" voltage of transistor Q1, which enables inverter 106. The output of inverter 106 is applied to the gates of transistors Q5 and Q6, and (collectively with resistor R4) transistors Q5 and Q6 generate a slew-controlled intermediate signal or voltage at node N1, which (when the inverter 106 is enabled) is at ground. Because the voltage applied to the input terminal VIN is negative, the pulling of the gate of transistor Q7 to ground turns transistor Q7 "on," enabling a negative output signal to be provided through output pin VOUT. Therefore, the output signal (at output pin VOUT) can be ground (applied to the ground pin GND) when transistor Q1 is "off" and can be the negative voltage (applied to the input pin VIN) when transistor Q1 is "on."

Figure 2:
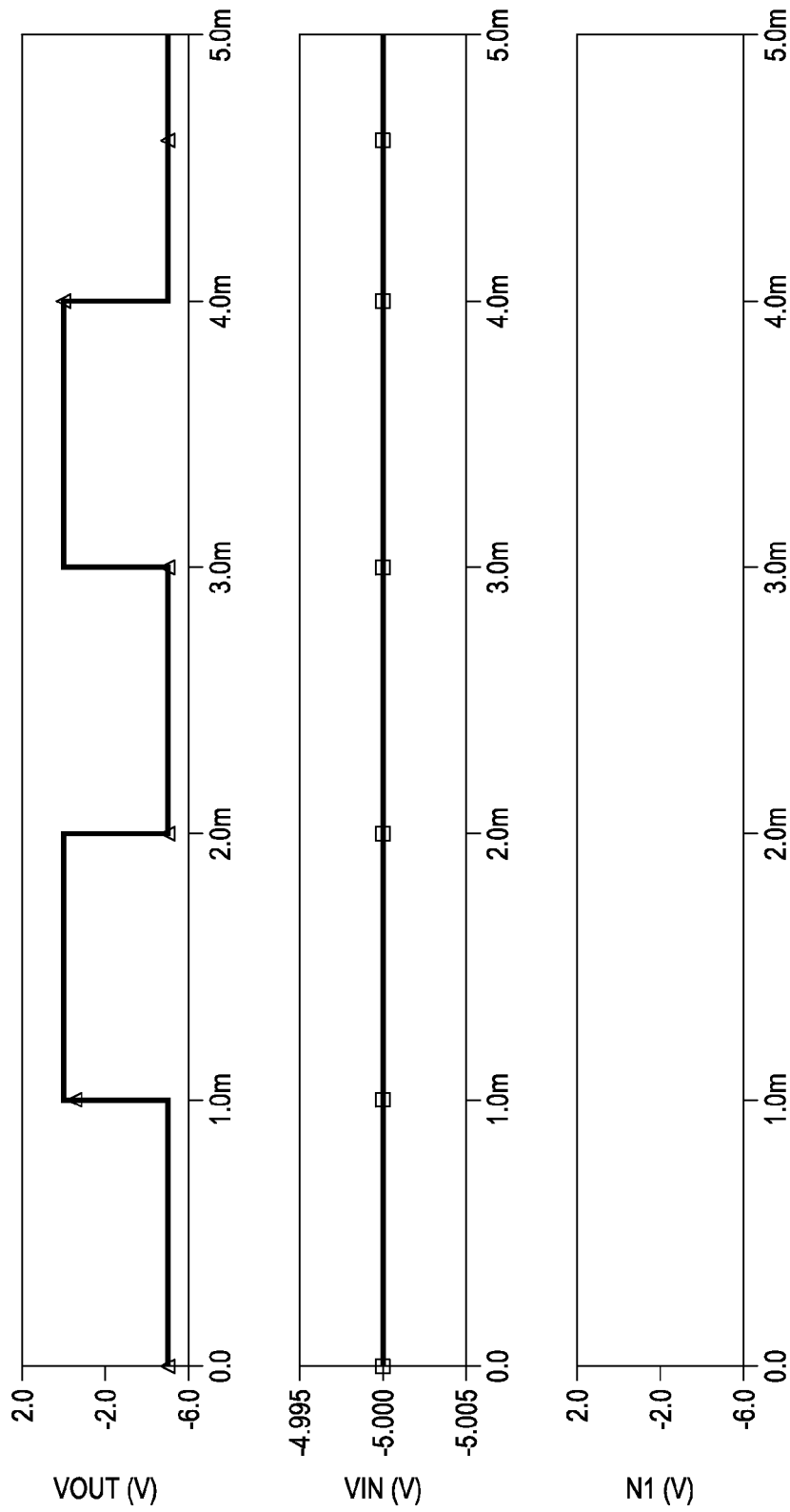
FIG. 2 is an diagram depicting an example of the operation of the IC of FIG. 1.

Turning to FIG. 2, an example of the operation of IC 100 can be seen. In this example, the input voltage applied to input pin VIN is −5V. Additionally, as the enable signal (which is applied to the enable pin VON) toggles, the output signal from output pin VOUT toggles. Additionally, as shown, the slew-controlled intermediate signal (at node N1) toggles inversely with the output signal (at the output pint VOUT).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An integrated circuit (IC) comprising:
   an enable pin;
   a ground pin;
   an input pin;
   an output pin;
   a load switch that is coupled between the input pin and the output pin, wherein the load switch receives a negative voltage through the input pin; and
   control circuitry that is coupled to the enable pin, the ground pin, and the load switch, wherein the control circuitry controls the load switch, and wherein the control circuitry uses the ground pin as a positive supply rail and the input pin as an internal ground,
   wherein the control circuitry further comprises:
   a level shifter that is coupled to the ground pin, the input pin, and the enable pin; and a slew rate controller that is coupled to the level shifter, the input pin, and the load switch,
wherein the level shifter further comprises:
a current mirror that is coupled to the input pin;
a current control circuit that is coupled between the ground pin and the current mirror;
a transistor having a first passive electrode, a second passive electrode, and a control electrode, wherein the control electrode of the transistor is coupled to the ground pin, and wherein the first passive electrode of the transistor is coupled to the enable pin; and
an impedance network that is coupled between the second passive electrode of the transistor and the current mirror and that is coupled to the slew rate controller.

2. The IC of claim 1, wherein the impedance network further comprises a first impedance network, and wherein the transistor further comprise a first transistor, and wherein the slew rate controller further comprises:
an inverter having a first power terminal, a second power terminal, an input terminal, and an output terminal, wherein the first power terminal of the inverter is coupled to the ground pin, and wherein the second power terminal of the inverter is coupled to the input pin, and wherein the input terminal of the inverter is coupled to the first impedance network;
a second transistor having a first passive electrode, a second passive electrode, and a control electrode, wherein the control electrode of the second transistor is coupled to the output terminal of the inverter, and wherein the first passive electrode of the second transistor is coupled to the ground pin;
a second impedance network that is coupled to the second passive electrode of the second transistor and the load switch; and
a third transistor having a first passive electrode, a second passive electrode, and a control electrode, wherein the control electrode of the third transistor is coupled to the output terminal of the inverter, and wherein the first passive electrode of the third transistor is coupled to the second impedance network, and wherein the second passive electrode of the third transistor is coupled to the input pin.

3. The apparatus of claim 2, wherein the first impedance network further comprises a plurality of resistors coupled in series with one another.

4. The apparatus of claim 2, wherein the first, second, and third transistors further comprise a first PMOS transistor, a second PMOS transistor, and an NMOS transistor.

5. A method comprising:
level shifting an enable signal to generate an intermediate signal by using input pin as an in as an internal ground and ground pin as a positive supply rail, wherein a negative voltage is applied to the input pin;
controlling the skew of the intermediate signal; and
activating a load switch with a skew-controlled intermediate signal, wherein the load switch is coupled between an output pin and the input,
wherein the step of level shifting further comprises:
generating a steering current between the ground pin and the input pin;
activating a first transistor when the enable signal becomes greater than the threshold voltage of the first transistor;
mirroring the steering current when the first transistor is activated;
dividing the enable signal to generate the intermediate signal; and applying the intermediate signal to a skew rate controller so as to generate the skew-controlled intermediate signal.

6. The method of claim 5, wherein the load switch further comprises an NMOS transistor, and wherein the step of activating the load switch further comprises pulling the gate of the NMOS transistor to ground.

7. An IC comprising:
an enable pin;
a ground pin;
an input pin;
an output pin;
a NMOS transistor that is coupled to the output pin at its drain and the input pin at its source, wherein the a negative voltage is applied to the source of the NMOS transistor through the input pin; and
control circuitry that is coupled to the enable pin, the ground pin, and the load switch, wherein the control circuitry controls the load switch, and wherein the control circuitry uses the ground pin as a positive supply rail and the input pin as an internal ground,
wherein the control circuitry further comprises:
a level shifter that is coupled to the ground pin, the input pin, and the enable pin; and
a slew rate controller that is coupled to the level shifter, the input pin, and the load switch,
wherein the level shifter further comprises:
a current mirror that is coupled to the input pin;
a resistor that is coupled between the ground pin and the current mirror;
a PMOS transistor that is coupled to the ground pin at its gate and the enable pin at its source; and
an voltage divider that is coupled between the drain of the PMOS transistor and the current mirror.

8. The IC of claim 7, wherein the NMOS transistor further comprises a first NMOS transistor, and wherein the resistor further comprises a first resistor, and wherein the slew rate controller further comprises:
an inverter having a first power terminal, a second power terminal, an input terminal, and an output terminal, wherein the first power terminal of the inverter is coupled to the ground pin, and wherein the second power terminal of the inverter is coupled to the input pin, and wherein the input terminal of the inverter is coupled to the voltage divider;
a second PMOS transistor that is coupled to the output terminal of the inverter at its gate and the ground pin at its source;
a second resistor that is coupled to the drain of the second PMOS transistor and the gate of the first NMOS transistor; and
a second NMOS transistor that is coupled to the output terminal of the inverter at its gate, the second resistor at its drain, and the input pin at its source.

9. The apparatus of claim 8, wherein the voltage divider further comprises:
a third resistor that is coupled between the drain of the first PMOS transistor and the input terminal of the inverter; and
a fourth resistor that is coupled between the input terminal of the inverter and the current mirror.

10. The apparatus of claim 9, wherein the current mirror further comprises:
a third NMOS transistor that is coupled to the first resistor at its drain and gate and the input pin at its source; and a fourth NMOS transistor that is coupled to the fourth resistor at its drain, the gate of the third NMOS transistor at its gate, and the input pin at its source.

* * * * *